United States Patent
Lee et al.

(10) Patent No.: US 8,242,016 B2
(45) Date of Patent: Aug. 14, 2012

(54) APPROACH FOR REDUCING COPPER LINE RESISTIVITY

(75) Inventors: Hsien-Ming Lee, Changhua (TW); Minghsing Tsai, Chu-Pei (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 697 days.

(21) Appl. No.: 11/803,282

(22) Filed: May 14, 2007

(65) Prior Publication Data
US 2008/0286965 A1 Nov. 20, 2008

(51) Int. Cl.
*H01L 21/44* (2006.01)
*H01L 21/4763* (2006.01)

(52) U.S. Cl. ............... 438/643; 438/597; 257/E21.495

(58) Field of Classification Search .................. None
See application file for complete search history.

(56) References Cited

U.S. PATENT DOCUMENTS

| | | | |
|---|---|---|---|
| 5,130,274 A | 7/1992 | Harper et al. | |
| 5,659,201 A | 8/1997 | Wollesen | |
| 6,211,075 B1 | 4/2001 | Liu et al. | |
| 6,294,832 B1 | 9/2001 | Yeh et al. | |
| 6,420,189 B1 | 7/2002 | Lopatin | |
| 6,433,379 B1 | 8/2002 | Lopatin et al. | |
| 6,465,867 B1 | 10/2002 | Bernard et al. | |
| 6,589,329 B1 | 7/2003 | Baum et al. | |
| 6,713,373 B1 | 3/2004 | Omstead | |
| 6,803,310 B2 * | 10/2004 | Wang et al. | 438/672 |
| 6,846,739 B1 | 1/2005 | Cathey et al. | |
| 6,936,535 B2 | 8/2005 | Kim et al. | |
| 6,951,812 B2 | 10/2005 | Jiang et al. | |
| 7,037,836 B2 | 5/2006 | Lee | |
| 7,179,759 B2 | 2/2007 | Huang et al. | |
| 7,612,451 B2 | 11/2009 | Shih et al. | |
| 2001/0031539 A1 | 10/2001 | Uhlenbrock et al. | |
| 2002/0009880 A1 * | 1/2002 | Jiang et al. | 438/643 |
| 2002/0022334 A1 | 2/2002 | Yang et al. | |
| 2002/0024139 A1 | 2/2002 | Chan et al. | |
| 2003/0183940 A1 | 10/2003 | Noguchi et al. | |
| 2004/0043333 A1 | 3/2004 | Keller | |
| 2004/0147115 A1 * | 7/2004 | Goundar et al. | 438/687 |

(Continued)

FOREIGN PATENT DOCUMENTS

| CN | 1185033 A | 6/1998 |
|---|---|---|
| CN | 1438691 | 8/2003 |
| CN | 1623228 A | 6/2005 |

(Continued)

OTHER PUBLICATIONS

Prater, W.L., et al., "Reduction of resistivity in Cu thin films by partial oxidation: Microstructural mechanisms," Applied Physics Letters, Apr. 5, 2004, pp. 2518-2520, vol. 84, No. 14, American Institute of Physics.

*Primary Examiner* — Seahvosh Nikmanesh
(74) *Attorney, Agent, or Firm* — Slater & Matsil, L.L.P.

(57) ABSTRACT

A method for fabricating an integrated circuit structure and the resulting integrated circuit structure are provided. The method includes forming a low-k dielectric layer; form an opening in the low-k dielectric layer; forming a barrier layer covering a bottom and sidewalls of the low-k dielectric layer; performing a treatment to the barrier layer in an environment comprising a treatment gas; and filling the opening with a conductive material, wherein the conductive material is on the barrier layer.

9 Claims, 5 Drawing Sheets

U.S. PATENT DOCUMENTS

| | | |
|---|---|---|
| 2006/0019485 A1* | 1/2006 | Komai et al. ............... 438/627 |
| 2007/0161128 A1 | 7/2007 | Ueno |
| 2007/0257369 A1 | 11/2007 | Huang |
| 2008/0012133 A1 | 1/2008 | Shih et al. |
| 2010/0171220 A1 | 7/2010 | Huang |

FOREIGN PATENT DOCUMENTS

| | | |
|---|---|---|
| CN | 1755914 | 4/2006 |
| JP | 2000-252285 | 9/2000 |
| KR | 2004/0064977 A | 7/2004 |

* cited by examiner

APPROACH FOR REDUCING COPPER LINE RESISTIVITY

CROSS-REFERENCE TO RELATED APPLICATION

This application is related to the following commonly assigned, co-pending U.S. patent applications: patent application Ser. No. 11/429,879, filed May 8, 2006, entitled "Reducing Resistivity in Interconnect Structures of Integrated Circuits," and patent application Ser. No. 11/486,893, filed Jul. 13, 2006, entitled "Reducing Resistivity in Interconnect Structures by Forming an Inter-Layer," which applications are incorporated herein by reference.

TECHNICAL FIELD

This invention relates generally to integrated circuits, and more particularly to the structure and formation methods of interconnect structures in integrated circuits.

BACKGROUND

In the manufacturing of integrated circuits, after the individual devices such as the transistors have been fabricated on the semiconductor substrate, they must be interconnected in order to perform the desired circuit functions. This interconnection process is generally called "metallization" and is performed using a number of different photolithographic, deposition, and removal techniques.

A commonly used process for forming interconnect structures is referred to as a "damascene" process. In a typical damascene process, dielectric layers are deposited over the devices, followed by the formation of openings in the dielectric layers. Conductive materials are then deposited in the openings. A polish process is used to planarize the conductive materials with the surfaces of the respective dielectric layers causing the conductive materials to be "inlaid" in the respective dielectric layers.

Copper is typically used for the damascene processes. Copper has low resistivity, thus the RC delay caused by the resistance in the interconnect structure is low. However, with the scaling down of the integrated circuits, the dimensions of copper interconnects are also accordingly scaled down. When the dimensions of the copper interconnects approach the mean free path of electrons, the resistivity of the interconnect structure significantly increases. As a result, the RC delay from the interconnect structure significantly increases.

Various methods have been explored to reduce the resistivities of the interconnect structures. For example, barrier layers, which are used to prevent copper from diffusing into neighboring low-k dielectric layers, typically have high resistivities. Thus, methods for forming thinner barrier layers were explored. Accordingly, copper lines will have greater sizes even though the sizes of the trenches, in which barrier layers and copper lines are formed, are not reduced. Also, atomic layer deposition (ALD) is used to form diffusion barrier layers for reducing the resistivity of copper lines formed thereon. These methods, however, incur additional problems. For example, thinner barrier layers may have reduced ability to prevent copper diffusion. In addition, electro-migration and/or stress-migration problems may arise. The use of ALD may cause the precursors to penetrate into the pores of low-k dielectric layer. Since the precursors include metals, the characteristics of the low-k dielectrics are adversely affected.

New methods are thus needed for reducing the resistivities of copper lines while at the same time overcoming the deficiencies of the prior art.

SUMMARY OF THE INVENTION

In accordance with one aspect of the present invention, a method for fabricating an integrated circuit structure includes forming a low-k dielectric layer; form an opening in the low-k dielectric layer; forming a barrier layer covering a bottom and sidewalls of the low-k dielectric layer; performing a treatment to the barrier layer in an environment comprising a treatment gas; and filling the opening with a conductive material, wherein the conductive material is on the barrier layer.

In accordance with another aspect of the present invention, a method for fabricating an integrated circuit structure include providing a substrate; forming a low-k dielectric layer over the substrate; forming an opening extending from a top surface of the low-k dielectric layer into the low-k dielectric layer; forming a diffusion barrier layer lining the opening; performing a treatment to the diffusion barrier layer in a hydrogen-containing environment, wherein no vacuum break occurs between the step of forming the diffusion barrier layer and the step of performing the treatment; forming a seed layer on the diffusion barrier layer; and filling the opening with a copper-containing material.

In accordance with yet another aspect of the present invention, a method for forming an integrated circuit structure includes providing a substrate; forming a low-k dielectric layer over the substrate; forming an opening extending from a top surface of the low-k dielectric layer into the low-k dielectric layer; blanket forming a diffusion barrier layer over the low-k dielectric layer, wherein the diffusion barrier layer covers exposed portions of low-k dielectric layer in the opening; performing a treatment to the diffusion barrier layer in an environment containing a process gas selected from the group consisting essentially of hydrogen, ammonia, and combinations thereof; forming a copper seed layer on the diffusion barrier layer after the step of the treatment, wherein no vacuum break occurs between the step of forming the diffusion barrier layer and the step of forming the seed layer; and filling the opening with a copper-containing material.

In accordance with yet another aspect of the present invention, an integrated circuit structure includes a dielectric layer; an opening in the dielectric layer; and a damascene structure in the opening. The damascene structure includes a barrier layer in the opening and in contact with the dielectric layer; a conductive material filling the opening; and an interlayer between and adjoining the barrier layer and the conductive material, wherein the interlayer comprises a hydride compound.

In accordance with yet another aspect of the present invention, an integrated circuit structure includes a dielectric layer; an opening in the dielectric layer extending from a top surface of the dielectric layer into the dielectric layer; a barrier layer in the opening and in contact with the dielectric layer; an hydrogen-containing compound layer over the barrier layer; and a conductive material comprising copper on the hydrogen-containing compound layer and filling the opening.

The advantageous features of the present invention include improved resistivity of copper lines. In addition, the embodiments of the present invention are fully compatible with the existing integrated circuit fabrication processes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
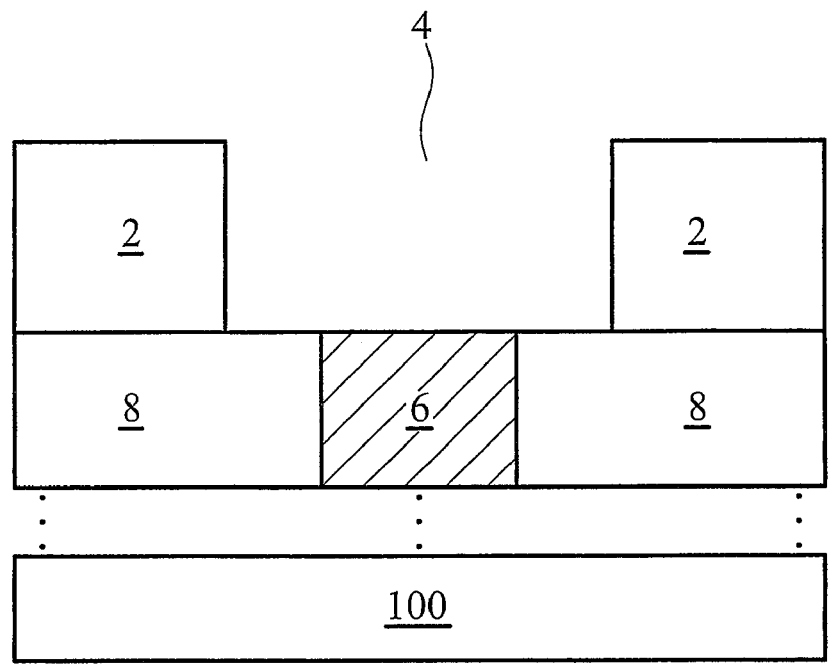
FIGS. 1 through 6 are cross-sectional views of intermediate stages in the manufacturing of a preferred embodiment.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIGS. 1 through 6 illustrate a preferred embodiment of the present invention, wherein a single damascene process is discussed. By slightly changing the formation process, however, the solution provided by the embodiments of the present invention can be applied to dual damascene processes. Throughout the description, like reference numerals are used to indicate like elements.

FIG. 1 illustrates the formation of opening 4 in dielectric layer 2. Dielectric layer 2 and an underlying dielectric layer 8 are preferably formed over substrate 100, which may be formed of silicon, silicon germanium, and or other group III, group IV and/or group V compounds. For simplicity, semiconductor substrate 100 is not shown in subsequent drawings. In the preferred embodiment, dielectric layer 2 has a low dielectric constant (k value), preferably less than about 3.5, and more preferably less than about 3.0. The formation methods of dielectric layers 2 and 8 include spin-on, chemical vapor deposition (CVD), plasma enhanced CVD (PECVD), atomic layer deposition (ALD), low pressure CVD (LPCVD), and other known deposition techniques. Conductive feature 6 is schematically shown to illustrate how the subsequently formed metal line is connected to other conductive features. Conductive feature 6 may be a contact plug or a via. Preferably, opening 4 is formed by etching dielectric layer 2.

Figure 2:
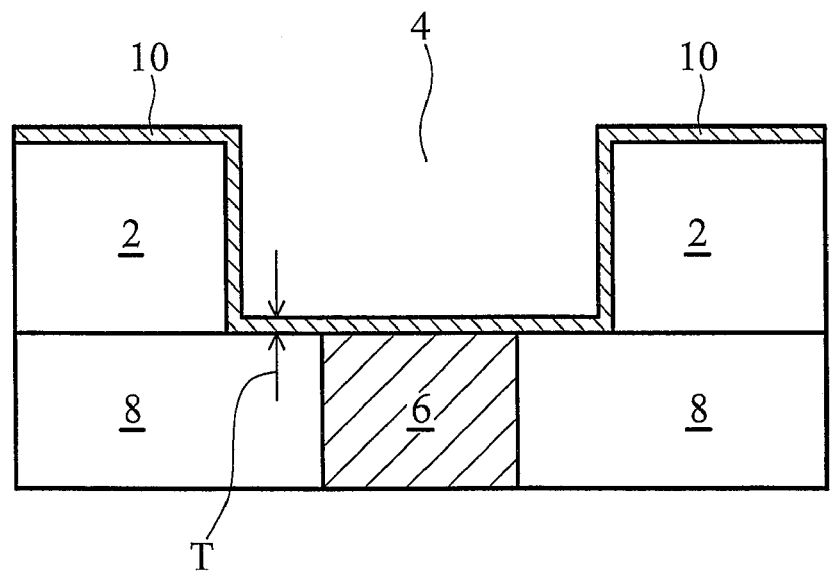

FIG. 2 illustrates the formation of diffusion barrier layer 10 in opening 4 and over dielectric layer 2. In an embodiment, diffusion barrier layer 10 is a refractory metal layer comprising tantalum, titanium, tungsten, ruthenium, and/or combinations thereof. Other commonly used diffusion barrier materials such as nitrides of tantalum, titanium, tungsten, ruthenium, and combinations thereof, can also be used. Diffusion barrier layer 10 may include a single layer or more than one layer, for example, a tantalum layer and a tantalum nitride layer. The formation methods include commonly used methods such as physical vapor deposition (PVD), sputtering, CVD, ALD, and the like. The thickness T of the diffusion barrier layer 10 is preferably less than about 400 Å.

Figure 3:
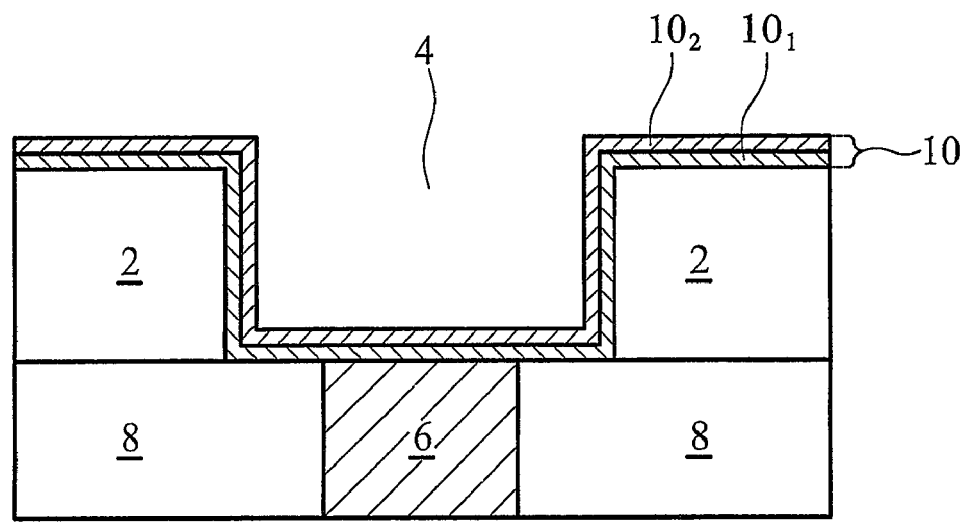

Referring to FIG. 3, a treatment is performed on diffusion barrier layer 10, wherein the treatment is preferably performed in process gases having reduction functions. In a first embodiment, an upper portion of diffusion barrier layer 10 is converted into compound layer 10$_2$, as illustrated in FIG. 3, wherein the composition of compound layer 10$_2$ depends on the process gases. A lower portion 10$_1$ of diffusion barrier layer 10 remains unconverted. In other embodiments, substantially the entire diffusion barrier layer 10 is converted into compound layer 10$_2$. In the preferred embodiment, the process gases include hydrogen ($H_2$), ammonia ($NH_3$), or combinations thereof. Carrier gases such as He, Ne, Ar, Kr, Xe and Rn, and combinations thereof, can also be included in the process gases. Preferably, the treatment lasts for between about 10 seconds and about 60 seconds. In an exemplary embodiment, the process gases have a low pressure of between about 3 mtorr and about 0.5 torr.

In the preferred embodiment, the treatment is performed with the plasma turned on. In alternative embodiments, the treatment includes soaking diffusion barrier layer 10 in the process gases, wherein the soaking is preferably performed at elevated temperatures, for example, between about 150° C. and about 350° C. In yet other embodiments, the treatment includes remote plasma treatment, wherein the plasma of the process gases is generated in a separate chamber from where the treatment is performed. More preferably, the remote plasma treatment is a radical treatment, wherein the ions of the processes gases are removed before the plasma is used for the treatment.

The treatment results in the characteristic change in diffusion barrier layer 10. Although the mechanism of the characteristic change in diffusion barrier layer 10 is not fully understood, it is expected that the treatment may cause the incorporation of hydrogen into at least a top surface of diffusion barrier layer 10, and hence forming hydride (hydrogen-containing) layer 10$_2$, which is schematically illustrated in FIG. 3.

Figure 4:
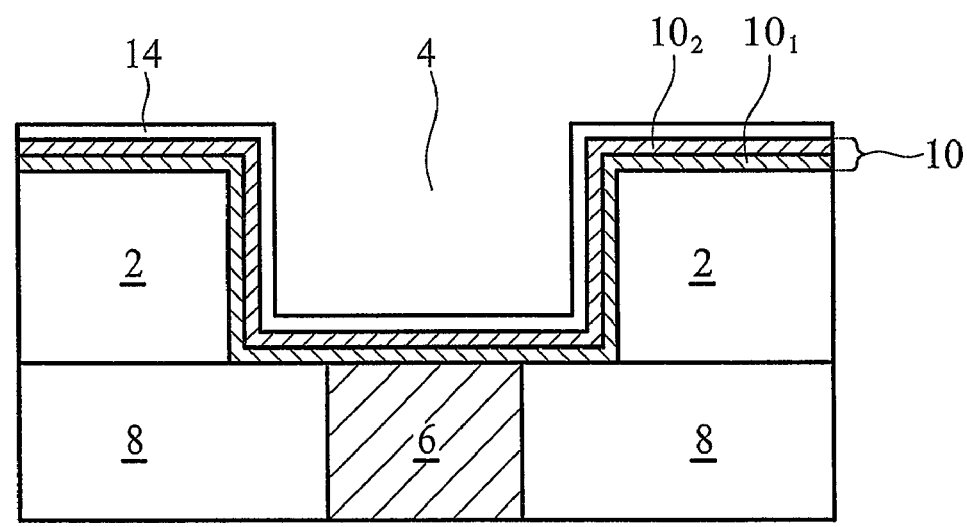

Referring to FIG. 4, copper seed layer 14 is formed. In the preferred embodiment, copper seed layer 14 is formed using PVD, although other commonly used methods such as electroless plating can also be used.

The treatment is preferably performed in-situ with the formation of diffusion barrier layer 10. More preferably, the treatment is performed in-situ with the formation of both diffusion barrier layer 10 and copper seed layer 14, and thus there is no vacuum break between forming diffusion barrier layer 10 and forming copper seed layer 14. Throughout the description, the term "in-situ" references to as no vacuum break occurring between the concerned processes, although the concerned processes, such as the formation of diffusion barrier layer 10, the treatment, and the formation of copper seed layer 14, may be physically performed in different chambers. Advantageously, by in-situ performing the processes, the interface between diffusion barrier layer 10 and copper seed layer 14 is not exposed to the adverse external environment, and hence the interface between diffusion barrier layer 10 and copper seed layer 14 is not degraded.

Alternatively, the treatment is performed ex-situ with the formation of diffusion barrier layer 10 and/or the formation of copper seed layer 14. Accordingly, the vacuum environments between the formation of diffusion barrier layer 10 and the formation of copper seed layer 14 are broken.

Figure 5:
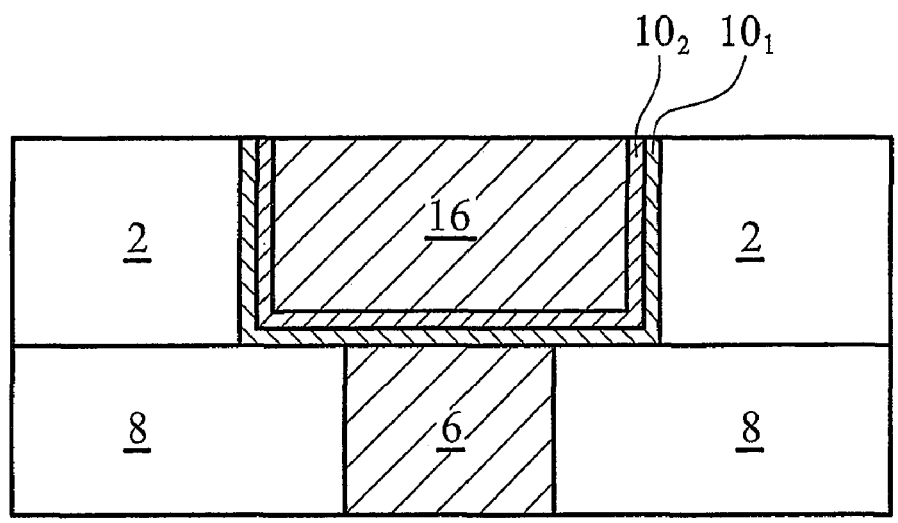

Referring to FIG. 5, metal line 16 is formed in opening 4. Metal line 16 preferably comprises copper or copper alloys. As a result, copper seed layer 14 is merged into metal line 16. However, other metals such as aluminum, silver, tungsten, and the like, can also be used. The formation methods include electro plating and other known methods. A chemical mechanical planarization (CMP), also sometimes referred to as a chemical mechanical polish, is performed to remove excess copper and the portions of diffusion barrier layer 10 on dielectric layer 2.

Figure 6:
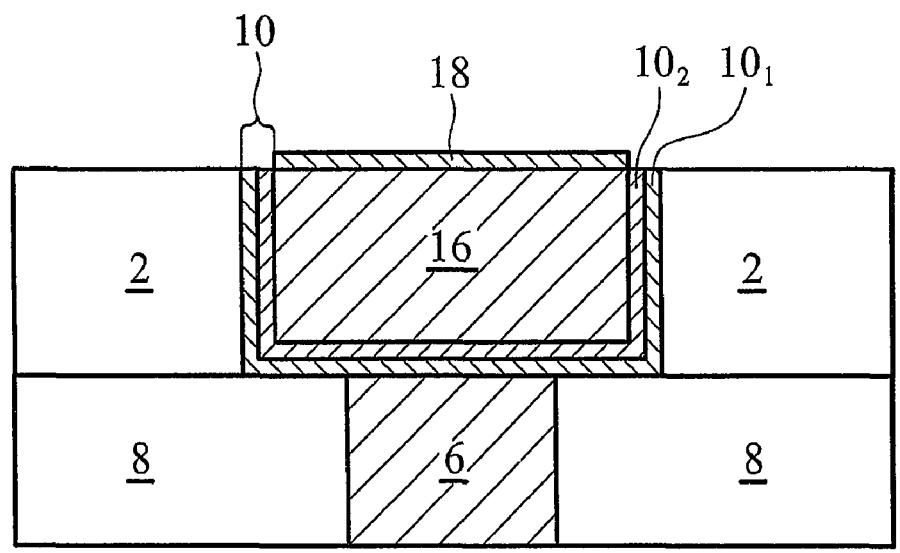

FIG. 6 illustrates metal cap layer 18 formed on the metal line 16. In the preferred embodiment, metal cap layer 18 includes nickel, cobalt, tungsten, tantalum, titanium, and combinations thereof.

Figure 7:
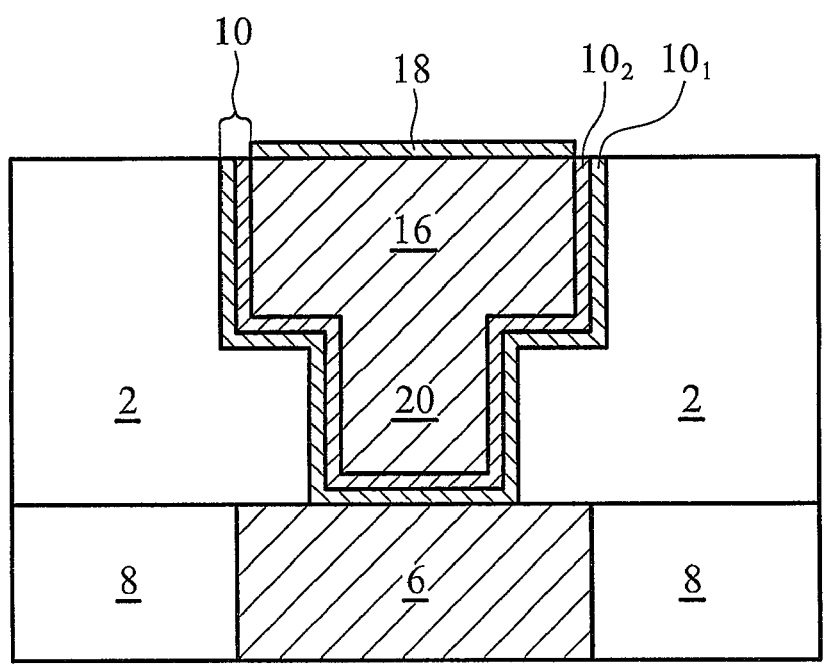
FIG. 7 illustrates a variation of the preferred embodiment having a dual damascene structure.

The above-discussed embodiment illustrates a single damascene process. One skilled in the art will realize that a dual damascene process may also be performed with the teaching of the preferred embodiment. FIG. 7 illustrates a dual damascene structure, which includes metal line 16 connected to via 20. One skilled in the art will realize the materials and process steps for forming the dual damascene structure by identifying the like reference numerals and comparing them with the previously discussed embodiment.

Figure 8:
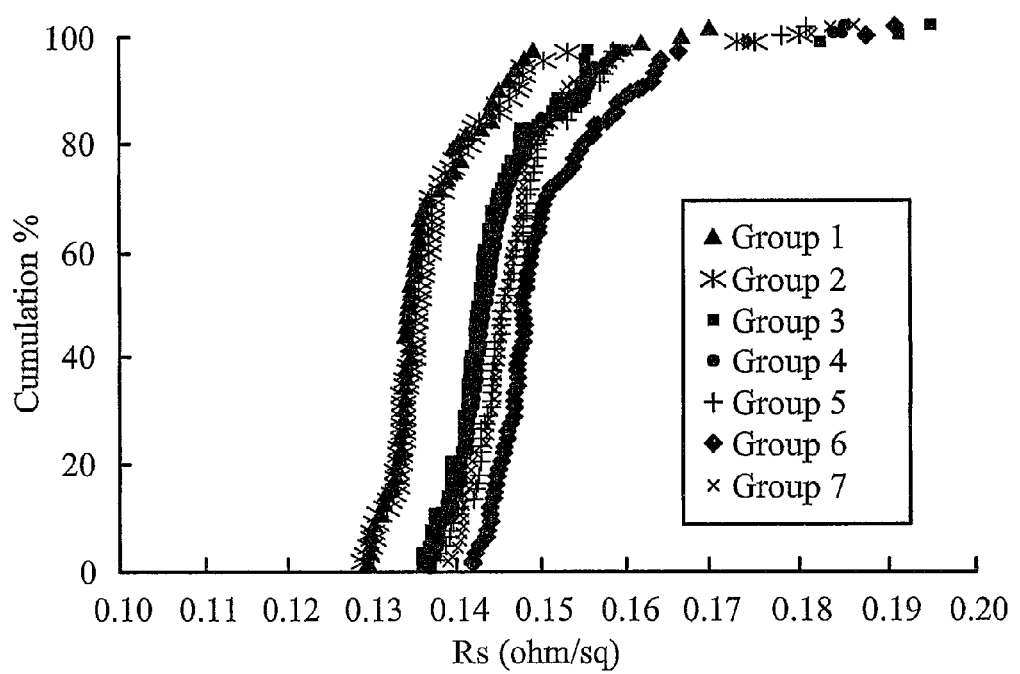
FIG. 8 illustrates results comparing embodiments of the present invention with prior art structures.

The treatment of the diffusion barrier layer 10 significantly affects the overall resistivity of metal line 16 and diffusion barrier layer 10. Experiments have been performed to compare seven groups of samples (metal lines). The diffusion barrier layers of samples in group 1 were treated with hydrogen plasma. The diffusion barrier layers of samples in group 2 were treated with remote hydrogen plasma. The diffusion barrier layers of samples in groups 3 through 7 were not treated. The experiment results are shown in FIG. 8, wherein the X-axis indicates the sheet resistance, and the Y-axis indicates the accumulative percentage. The experiment results have revealed that the resistivities of the samples in groups 1 and 2 are reduced by about 5.5 percent and about 4.8 percent than the samples in groups 3 through 7, respectively.

It is known that the resistivity of copper line may include four components, intrinsic resistivity, barrier volume related resistivity, grain-boundary scattering related resistivity, and surface scattering related resistivity. In the above-discussed seven groups of samples, the intrinsic resistivities, barrier volume related resistivities and grain-boundary scattering related resistivities of samples in sample groups 1 and 2 are expected to be the same as the samples in sample groups 3 through 7. This is due to the reason all samples in groups 1 through 7 are formed of similar deposition processes and similar materials. Therefore, it is expected that the treatment causes the change of surface characteristics of diffusion barrier layer 10, which in turn reduces the surface scattering related resistivity. As a result, the overall resistivity of metal lines is reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating an integrated circuit structure, the method comprising:
    forming a low-k dielectric layer;
    form an opening in the low-k dielectric layer;
    forming a barrier layer comprising sidewall portions and horizontal portions in the opening, wherein the sidewall portions cover sidewalls of the low-k dielectric layer in the opening;
    before performing any removal step to remove any horizontal portion of the barrier layer, performing a treatment to the barrier layer in an environment comprising a treatment gas selected from the group consisting essentially of hydrogen, ammonia, and combinations thereof, with the barrier layer being at an elevated temperature during the treatment, wherein after the step of performing the treatment, the sidewall portions of the barrier layer comprises an inner portion and an outer portion, wherein the outer portion separates the inner portion from a low-k dielectric material of the low-k dielectric layer, and wherein the inner portion and the outer portion of the barrier layer have different compositions;
    forming a seed layer on the barrier layer, wherein there is no vacuum break occurring between the treatment and the step of forming the seed layer; and
    filling the opening with a conductive material, wherein the conductive material is on the barrier layer.

2. The method of claim 1, wherein the step of filling the opening comprises
    forming the conductive material on the seed layer.

3. The method of claim 2, wherein the steps of forming the barrier layer, performing the treatment, and forming the seed layer are in-situ performed.

4. The method of claim 1, wherein the step of forming the barrier layer and the step of performing the treatment are in-situ performed.

5. The method of claim 1, wherein the step of forming the barrier layer and the step of performing the treatment are ex-situ performed.

6. The method of claim 1, wherein the barrier layer comprises a material selected from the group consisting essentially of tantalum, tantalum nitride, titanium, titanium nitride, and combinations thereof.

7. A method for fabricating an integrated circuit, the method comprising:
    providing a substrate;
    forming a low-k dielectric layer over the substrate;
    forming an opening extending from a top surface of the low-k dielectric layer into the low-k dielectric layer;
    blanket forming a diffusion barrier layer over the low-k dielectric layer, wherein the diffusion barrier layer covers exposed portions of low-k dielectric layer in the opening;
    performing a remote plasma treatment to the diffusion barrier layer in an environment containing a process gas selected from the group consisting essentially of hydrogen, ammonia, and combinations thereof, with a plasma used in the remote plasma treatment being generated in a different chamber than a chamber for performing the remote plasma treatment;
    forming a copper seed layer on the diffusion barrier layer after the step of the remote plasma treatment, wherein no vacuum break occurs between the step of forming the diffusion barrier layer and the step of forming the copper seed layer; and
    filling the opening with a copper-containing material.

8. The method of claim 7, wherein the step of the remote plasma treatment and the step of blanket forming the diffusion barrier layer are in-situ performed.

9. The method of claim 7, wherein after the step of performing the remote plasma treatment, sidewall portions of the barrier layer in the opening comprises an inner portion and an outer portion, wherein the outer portion separates the inner portion from a low-k dielectric material of the low-k dielectric layer, and wherein the inner portion and the outer portion have different compositions.

* * * * *